United States Patent
Tenaglia (10) Patent No.: US 9,159,611 B2
(45) Date of Patent: Oct. 13, 2015

(54) METHOD OF FORMING ELECTRIC CONTACT INTERFACE REGIONS OF AN ELECTRONIC DEVICE

(71) Applicant: STMicroelectronics S.r.l., Agrate Brianza (IT)

(72) Inventor: Dario Tenaglia, Gravina di Catania (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 248 days.

(21) Appl. No.: 13/925,658

(22) Filed: Jun. 24, 2013

(65) Prior Publication Data
US 2014/0021623 A1 Jan. 23, 2014

(30) Foreign Application Priority Data

Jul. 23, 2012 (IT) .............................. TO2012A00646

(51) Int. Cl.
| | |
|---|---|
| *H01L 21/768* | (2006.01) |
| *H01L 23/532* | (2006.01) |
| *H01L 21/027* | (2006.01) |
| *H01L 21/04* | (2006.01) |
| *H01L 29/45* | (2006.01) |
| *H01L 29/66* | (2006.01) |
| *H01L 29/16* | (2006.01) |

(52) U.S. Cl.
CPC ...... *H01L 21/76877* (2013.01); *H01L 21/0272* (2013.01); *H01L 21/0485* (2013.01); *H01L 23/53209* (2013.01); *H01L 29/45* (2013.01); *H01L 29/66068* (2013.01); *H01L 29/1608* (2013.01); *H01L 2924/0002* (2013.01)

(58) Field of Classification Search
CPC ................... H01L 21/02425; H01L 21/28052; H01L 21/28097; H01L 21/28537; H01L 21/76889
See application file for complete search history.

(56) References Cited

U.S. PATENT DOCUMENTS

2007/0281461 A1 * 12/2007 Jang .............................. 438/622

FOREIGN PATENT DOCUMENTS

| DE | 10 2007 029 829 A1 | 1/2009 |
|---|---|---|
| JP | 2002-93742 A | 3/2002 |
| WO | 2005/020308 A1 | 3/2005 |

OTHER PUBLICATIONS

Gambino, J. P. et al., "Silicides and ohmic contacts," Materials Chemistry and Physics, vol. 52, pp. 99-146, 1998.
Kim, S. et al., "Interface Reaction between Ni and Amorphous SiC," Journal of Electronic Materials 33(10):1064-1070, 2004.

(Continued)

*Primary Examiner* — Jae Lee
(74) *Attorney, Agent, or Firm* — Seed IP Law Group PLLC (57) ABSTRACT

A method for forming electrical-contact interface regions on a wafer including a silicon-carbide substrate having a surface with at least one conductive region facing the surface. The method includes forming a first and a second resist layer; forming; removing portions of the second resist layer to form a through opening partially aligned to the conductive region; removing, selective portions of the first resist layer to expose the surface of the substrate; removing portions of the first resist layer that extend laterally staggered with respect to the through opening; depositing a nickel layer on the wafer to form a nickel region on the substrate in an area corresponding to the conductive region; removing the first and second resist layers; and carrying out a step of thermal treatment of the wafer to form nickel-silicide regions in electrical contact with the conductive region.

23 Claims, 7 Drawing Sheets

(56) References Cited

OTHER PUBLICATIONS

Levit, M. et al., "Interaction of $Ni_{90}Ti_{10}$ alloy thin film with 6H-SiC single crystal," J. Appl. Phys. 80(1):167-173, Jul. 1, 1996.

Maex, K., "Silicides for integrated circuits: $TiSi_2$ and $CoSi_2$," Materials Science and Engineering R11(2-3), 103 pages, Nov. 1, 1993.

Pai, C.S. et al., "X-ray diffraction and ion backscattering study of thermally annealed Pd/SiC and Ni/SiC," J. Appl. Phys. 57(2):618-619, Jan. 15, 1985.

\* cited by examiner

METHOD OF FORMING ELECTRIC CONTACT INTERFACE REGIONS OF AN ELECTRONIC DEVICE

BACKGROUND

1. Technical Field

The present disclosure relates to a method of forming electrical-contact interface regions of an electronic device. In particular, the present disclosure is directed to formation of nickel-silicide electrical-contact interface regions; in particular, the nickel-silicide regions are formed on a silicon-carbide substrate.

2. Description of the Related Art

As is known, semiconductor materials that have a wide bandgap, in particular that have a value of energy Eg of the bandgap higher than 1.1 eV, low resistance in the ON state ($R_{ON}$), high value of thermal conductivity, high operating frequency, and high value of saturation of the speed of the charge carriers, are ideal for providing electronic components, such as, for example, transistors or switches, in particular for power applications. A material having said characteristics, and designed to be used for manufacturing electronic components, is silicon carbide (SiC). In particular, silicon carbide, in its different polytypes (for example, 3CSiC, 4H—SiC, 6H—SiC), is preferable to silicon as regards the properties listed previously.

Electronic devices made on a silicon-carbide substrate, as compared to similar devices made on a silicon substrate, possess a plurality of advantageous characteristics, such as, for example, a low output on-resistance, a low leakage current, a high working temperature, and high working frequencies.

A significant technological problem, encountered during steps for manufacturing electronic devices based upon SiC, regards structural defects observed following upon steps of formation of metal contacts used for supplying the appropriate electrical signals for biasing and/or control of said electronic devices (for example, for forming contacts of the source and drain terminals in the case of a transistor), as illustrated in the example of FIGS. 1-4.

Figure 1:
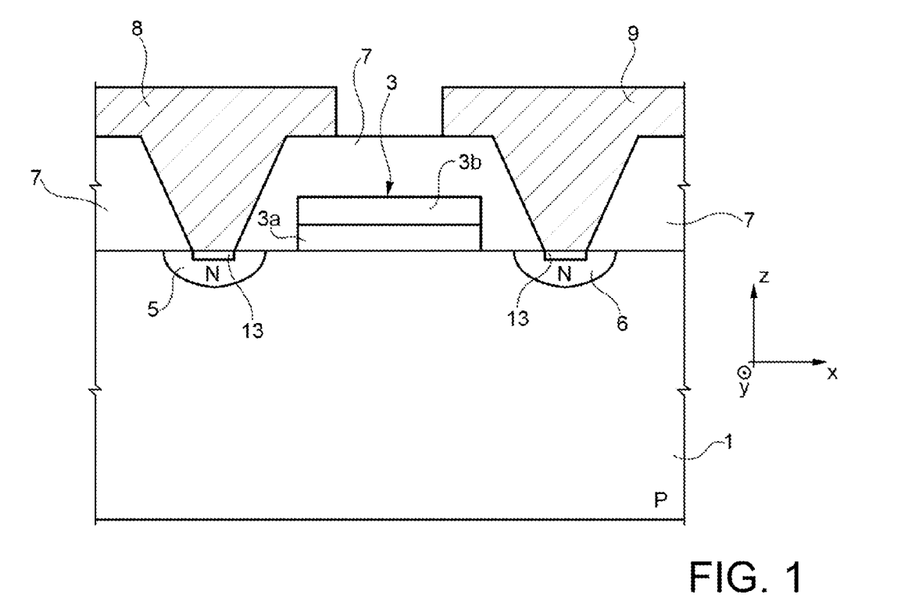
FIG. 1 shows, in cross-sectional view, a portion of an electronic device of a known type, having a substrate provided with electrical-contact interface regions.

With reference to FIG. 1, a wafer houses an electronic device (for example, a MOSFET), of a known type, and comprises: a semiconductor body 1, made of silicon carbide, having a P conductivity; a first conductive region 5 and a second conductive region 6 (source and drain, respectively), which extend in the semiconductor body and have a second type of conductivity (N); and an insulated-gate region 3 set on top of the semiconductor body 1, between the first and second conductive regions 5, 6. The gate region 3 comprises a dielectric layer 3a, in direct contact with the semiconductor body 1 and a conductive region 3b, set on top of the dielectric region 3a.

The semiconductor body 1 is insulated from the outside world by means of an insulating layer 7, which extends over the first and second conductive regions 5, 6 and the gate region 3. The first and second conductive regions 5, 6 are electrically accessible from the outside of the electronic device by means of respective metal contacts 8, 9 (in particular, the metal used is nickel), which extend through the insulating layer 7. The interface regions 13, between the first and second conductive regions 5, 6 and each respective metal contact 8, 9, are nickel-silicide regions $Ni_2Si$ that provide the electrical connection between the first and second conductive regions 5, 6 and the respective metal contact 8, 9.

Figure 2:
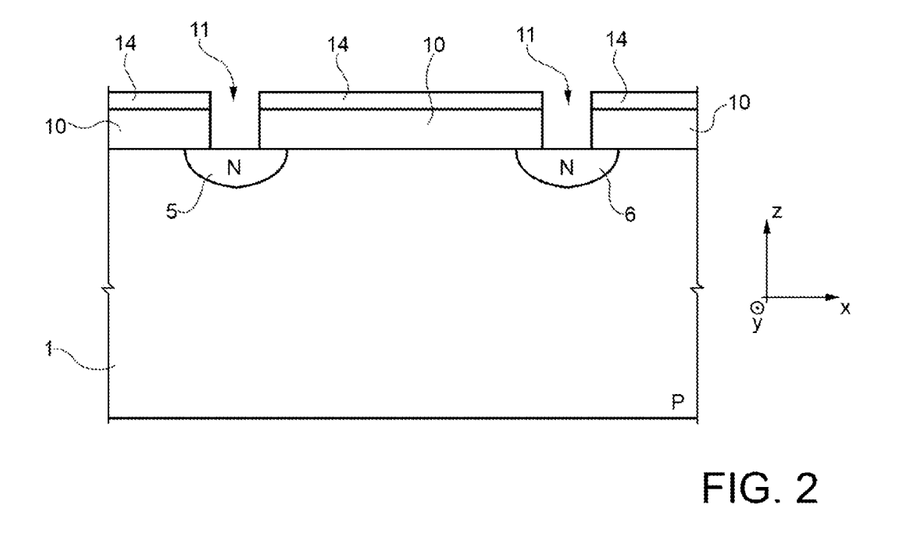
FIGS. 2-4 show the electronic device of FIG. 1 during mutually successive intermediate manufacturing steps.
Figure 3:
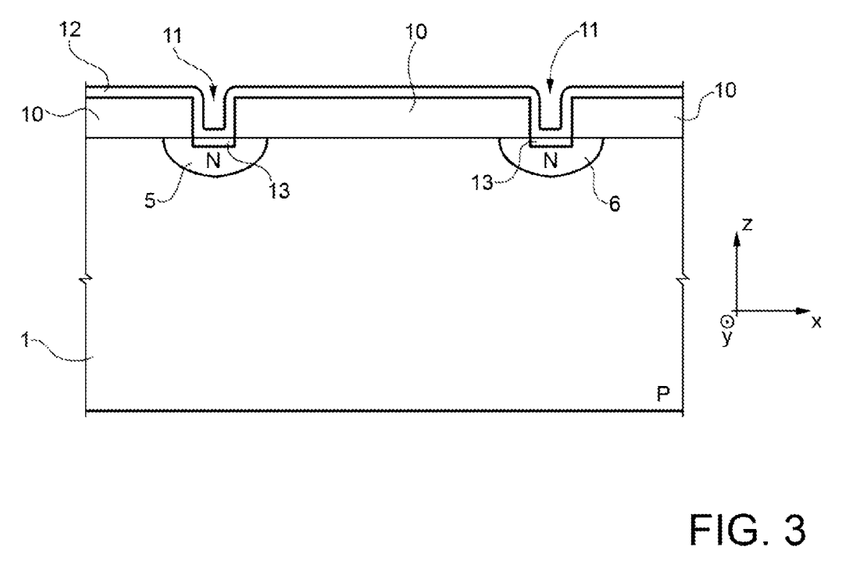

FIG. 2 shows the wafer comprising the electronic device of FIG. 1 in an intermediate manufacturing stage, in particular for the formation of the nickel-silicide regions 13.

In this case, formed on the semiconductor body 1 (housing the first and second conductive regions 5, 6) is a dielectric layer 10, of deposited silicon oxide or TEOS silicon oxide, having a thickness of between 0.5 µm and 2 µm. The dielectric layer 10 is then selectively etched using a photoresist mask 14 so as to form in the dielectric layer 10 openings 11 that expose the surface of the underlying semiconductor body 1. The openings are formed in the area of the first and second conductive regions 5, 6. In general, openings similar to the openings 11 are formed in the dielectric layer 10 wherever it is useful to form metal contacts.

Then (FIG. 3), the photoresist mask 14 is removed, and a metal layer 12, in particular a nickel layer, is formed on the dielectric layer 10 and on the surface of the semiconductor body 1, exposed via the openings 11. The metal layer 12 is deposited by means of the sputtering technique. A subsequent thermal process comprising a rapid thermal annealing (RTA) at a temperature of between 700° C. and 1100° C. for some minutes enables formation of the nickel-silicide regions 13 in the regions of direct contact between the semiconductor body 1 and the metal layer 12.

Then (FIG. 4), the metal layer 12 is etched, for example, using a solution of nitric acid $HNO_3$, to remove it from the wafer except for the nickel-silicide regions. Etching with nitric acid is selective with respect to silicide, which is not removed.

Figure 4:
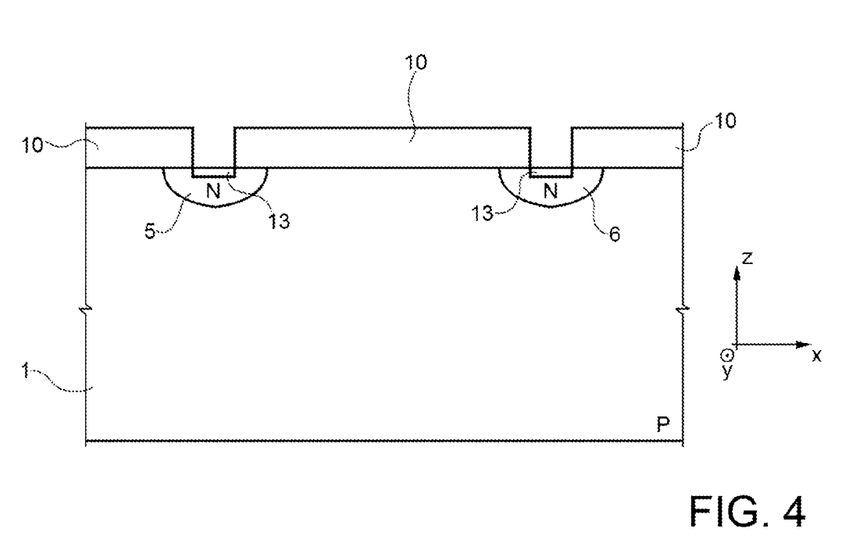

Moreover, also the dielectric layer 10 is removed, by means of a masked etch using hydrofluoric acid (HF).

The present applicant has found that the high temperatures used for the RTA step cause a reaction between the nickel of the metal layer 12 and the silicon oxide of the dielectric layer 10 such that there is formation of a thin interface layer between the dielectric layer 10 and the metal layer 12. This interface layer is (from XPS analysis) a matrix of nickel silicide, nickel oxide, nickel hydroxide, silicon oxide, and nickel atoms. Consequently, the step of etching with nitric acid $HNO_3$ of the metal layer 12 does not enable convenient removal also of the interface layer. A complete removal of the interface layer is possible by prolonging over time the step of etching with nitric acid $HNO_3$. The etching step can be prolonged over time by a factor of 6 or more.

The present applicant has likewise found that, following upon complete removal of the metal interface layer, the dielectric layer 10 presents a damaged surface. The damage of the dielectric layer 10 is an undesirable effect.

A possible solution to this problem comprises depositing, by means of sputtering, the metal layer 12 directly on the semiconductor body and then carrying out a masked etch of the metal layer 12 so as to remove the latter in the area of portions of the surface of the semiconductor body 1 in which it is not desired to form the nickel-silicide regions. The step of removal of the metal layer 12 can be performed by means of dry etching or wet etching. Dry etching of the metal layer 12, however, has revealed a poor selectivity in so far as, in addition to the metal layer 12, also oxides and/or other dielectrics present on the wafer are removed. Wet etching, instead, does not enable definition of the metal layer 12 with the desired precision, on account of the different rate of etching observable along planes parallel to the direction of etching with respect to planes orthogonal to the direction of etching.

Moreover, the step of removal of the dielectric layer 10 with hydrofluoric acid HF causes damage to the nickel silicide. In fact, typically, the layout of the devices in question do not enable formation of a mask that will cover also the parts where the silicide has already been formed.

BRIEF SUMMARY

The present disclosure is directed to a method that includes forming electrical-contact interface regions of an electronic device on a wafer, the wafer including a silicon-carbide semiconductor body of first type of conductivity, the body having at least one conductive region of a second type of conductivity. Forming the interface regions includes forming a first resist layer on a surface of the semiconductor body, forming a second resist layer on the first resist layer, and forming a through opening through the second resist layer by developing portions of the second resist layer, the through opening being at least partially aligned with said conductive region. The method includes exposing the surface of the body in an area corresponding to said conductive region by developing, through the through opening, portions of the first resist layer that extend underneath the through opening, removing portions of the first resist layer that extend laterally with respect to the through opening, forming a metal region on the body by depositing a first metal material on the wafer in the area corresponding to the conductive region, removing completely the first and second resist layers from the wafer, and forming a silicide region in electrical contact with the conductive region by thermally treating the wafer.

BRIEF DESCRIPTION OF THE SEVERAL VIEWS OF THE DRAWINGS

For a better understanding of the present disclosure, preferred embodiments thereof are now described, purely by way of non-limiting example, with reference to the attached drawings, wherein.

DETAILED DESCRIPTION

The manufacturing process described in what follows regards a generic electronic device. In fact, as will emerge clearly from the ensuing description, the process according to the present disclosure, with the appropriate variants, can be applied to any electronic device, whenever there is the need to form electrical-contact (ohmic-contact) regions integrated in the electronic device. In particular, said electrical-contact regions are silicide regions. Even more in particular, the silicide regions are formed by means of the RTA thermal process starting from a metal region formed in an area corresponding to a surface of a silicon-based semiconductor substrate of the electronic device. According to one embodiment, the substrate is made of silicon carbide (SiC). According to one embodiment, the metal region is made of nickel.

Figure 5:
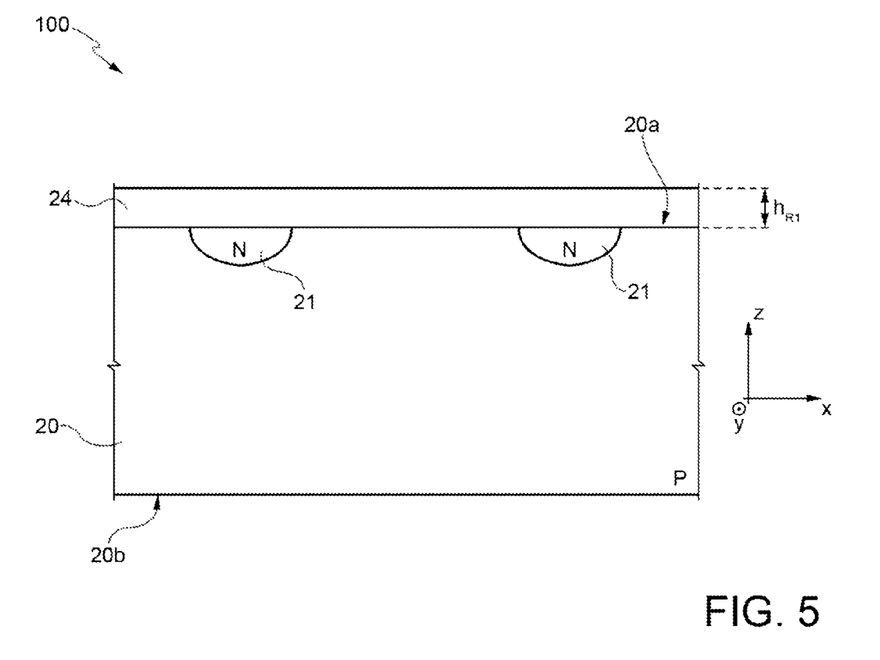
FIGS. 5-14 show, in cross-sectional view, steps for manufacturing electrical-contact interface regions of an electronic device, according to one embodiment of the present disclosure.

With reference to FIG. 5, according to one embodiment of the present disclosure, a wafer 100 is provided having a semiconductor body 20, made of semiconductor material having a first conductivity (P or N doping), in particular silicon carbide (SiC). The semiconductor body 20 comprises a top surface 20a and a bottom surface 20b, opposite to one another.

According to one embodiment (not illustrated in detail in the figures), the semiconductor body 20 includes a substrate and a structural layer, formed on the substrate and in direct contact therewith. The structural layer is, in particular, made of silicon carbide, whilst the substrate may be made of silicon carbide or of some other material, for example, silicon.

In the description, reference will be made to a system of axes X, Y, Z. In particular, the axes X and Y define a plane XY parallel to the plane of the semiconductor body 20, i.e., parallel to the top surface 20a and to the bottom surface 20b. The axis Z defines a direction orthogonal to the plane XY, i.e., orthogonal to the top surface 20a and bottom surface 20b.

FIG. 5 regards an intermediate step of processing of the wafer 100; in particular, the semiconductor body 20 is of the previously processed type and comprises at least one active area including conductive regions 21 that have a second conductivity (for example, but not necessarily, they have a doping opposite to that of the semiconductor body 20), and belong to one or more electronic devices (not illustrated in detail) integrated in the wafer 100. The conductive regions 21 are formed, for example, by implantation of dopant species, and extend in an area corresponding to the top surface 20a of the semiconductor body 20. According to further embodiments, the conductive regions 21 can extend throughout the wafer 100. The conductive region 21 can be formed in a way different from implantation, for example, by epitaxial growth of a doped layer, or some other method still.

With reference to FIG. 5, a first resist layer 24 is formed on the wafer 100, on top of the top surface 20a of the semiconductor body 20. In particular, the first resist layer 24 is formed in an area corresponding to the active area, on top of the conductive regions 21.

According to one embodiment, the resist layer 24 is formed in direct contact with the semiconductor body 20. According to a further embodiment (not illustrated), an interface layer designed to promote adhesion between the resist layer 24 and the semiconductor body 20 is set between the resist layer 24 and the semiconductor body 20. In any case, it is evident that the semiconductor body 20 should be cleaned prior to the step of formation of the first resist layer 24. For example, the semiconductor body 20 can be cleaned on the top surface 20a using an appropriate solvent and/or rinsed with de-ionized water. A subsequent step of heating at low temperature (e.g., between 50° C. and 200° C.) enables evaporation of the solvent and/or of the water.

The first resist layer 24 is a polydimethylglutarimide-based resist layer, for example, PMGI resist or LOR ("lift-off resist").

Figure 10:
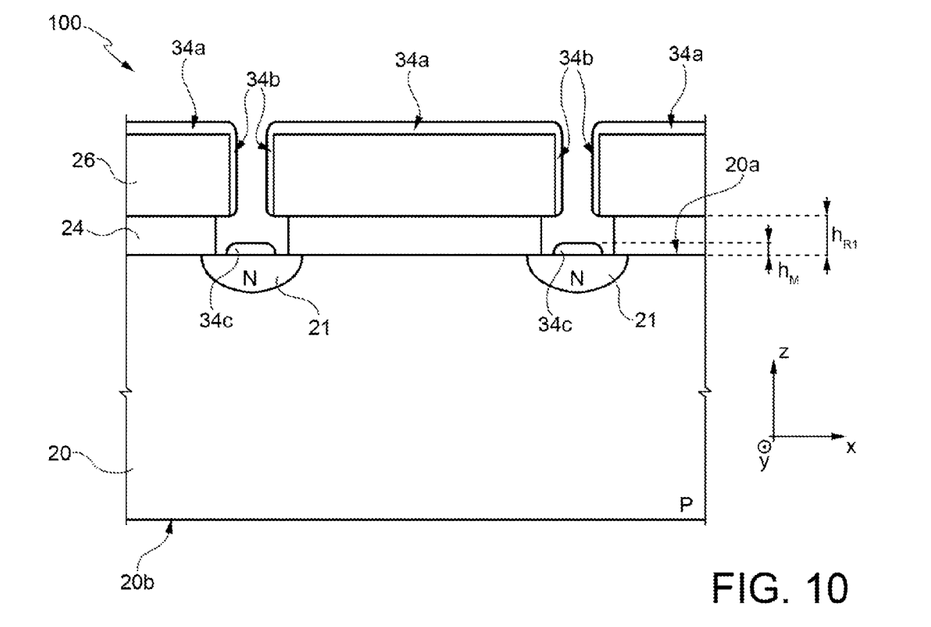

The first resist layer 24 has, for example, a thickness $h_{R1}$ (measured along Z, starting from the top surface 20a of the semiconductor body 20) of between 100 nm and 1 µm, for example, 300 nm; in any case, the thickness of the first resist layer 24 can be different from the one indicated herein, and chosen according to the need, as illustrated more fully in what follows with reference to FIG. 10.

According to one embodiment, assuming a wafer 100 with a diameter of 150 mm is used, the first photoresist layer 24 is formed by dispensing a volume of liquid photoresist of between approximately 2 ml and 7 ml on the wafer 100, at a speed of spin of the wafer 100 of between 200 and 600 r.p.m.; then, the spin speed is increased until it is brought up to approximately 2500-5000 r.p.m. for a total time of approximately 40-60 s. In this way, a good uniformity of covering of the wafer 100 is obtained. It is evident that, using a wafer 100 having a different diameter, the spin speed, as likewise the amount of photoresist dispensed, can be adapted accordingly to obtain the desired uniformity of covering of the wafer 100 and thickness of the first photoresist layer 24.

Then, a step of soft baking, at a temperature of between approximately 150° C. and 250° C., for a time of between 150 s and 400 s, enables stabilization of the chemico-physical properties of the first resist layer 24 for subsequent machining steps. The step of soft baking is typically performed on a hot-plate heated to the desired temperature. Alternatively, it is advantageous to use a convection oven.

Then (FIG. 6), a second resist layer 26 is deposited on the wafer 100, in particular on top of the first resist layer 24. The second resist layer 26 is a photoresist layer of a general-purpose type, for example, an OiR 906 or OiR 38 photoresist manufactured by Fujifilm. However, other photoresists can be used; in particular it is possible to use i-line, g-line, broadband, deep-UV, 193-nm, e-beam photoresists, and others still.

Figure 6:
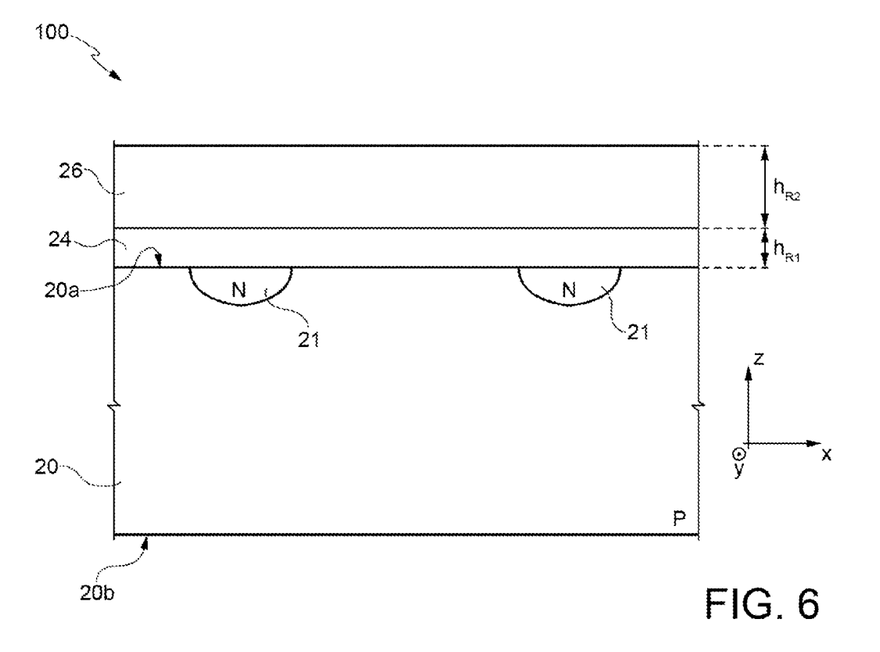

The second resist layer 26 has, for example, a thickness $h_{R2}$ (measured along Z, starting from a top surface of the first resist layer 24) of between 200 nm and 2 µm, for example, 500 nm; in any case, the thickness of the second resist layer 26 may differ from the one indicated here, and chosen according to the need, as illustrated more fully in what follows with reference to FIG. 10.

The second resist layer 26 is formed in direct contact with the first photoresist layer 24, without the need to use intermediate layers. Next, a step of pre-baking of the second resist layer 26 is performed, for stabilization of the chemico-physical properties of the photoresist of the second resist layer 26. The pre-baking temperature and time depend upon the type of photoresist used.

Figure 7:
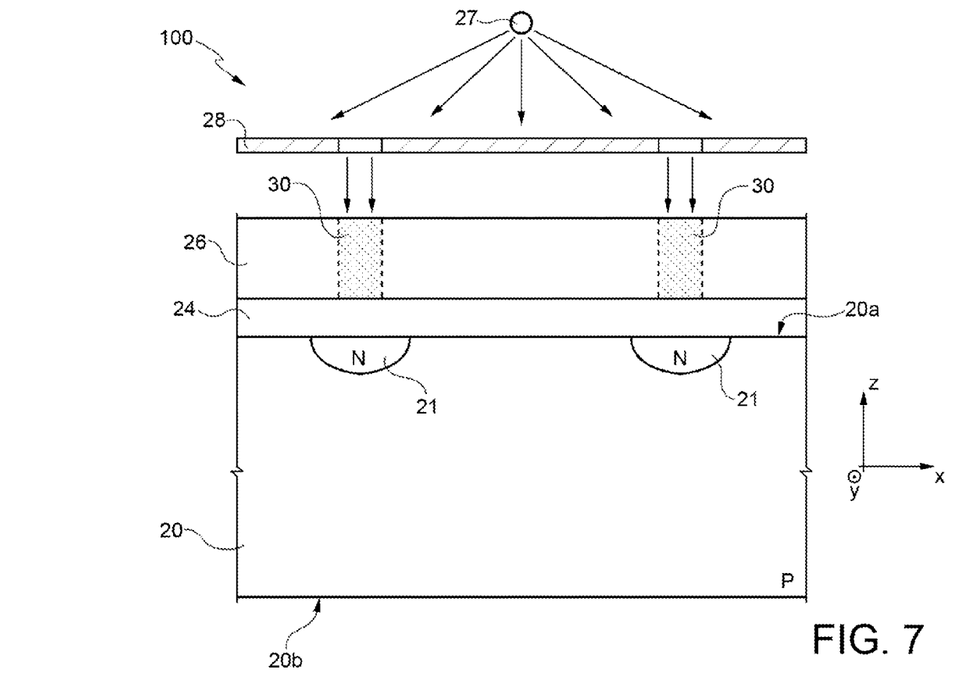

Then (FIG. 7), laid on the wafer 100 is a photolithographic mask 28, for defining photolithographically (by means of the light source 27), in an area corresponding to the second photoresist layer 26, areas 30. The areas 30 defined photolithographically correspond to respective areas of the semiconductor body 20 in which it is desired to form the metal contacts, which, at the end of the manufacturing steps, will form the conduction terminals of the electronic devices integrated in the wafer 100. According to the type of photoresist used for the second resist layer 26, the photolithography is of a positive type or negative type. FIG. 7 shows a photolithographic mask 28 for positive photolithography.

Next (FIG. 8), a step of development of the second resist layer 26 is carried out. For example, for developing the second resist layer 26 an OPD 4262 developer is used manufactured by Fujifilm. However, other developers may be used.

Figure 8:
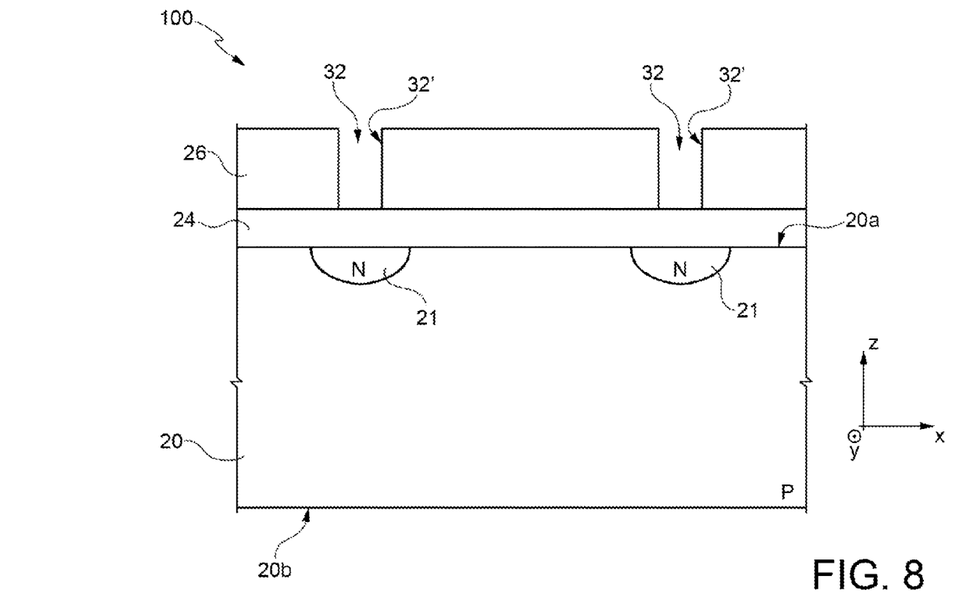

In particular, development of the second resist layer 26 enables through openings to be obtained in the second resist layer 26 that expose respective regions of the first resist layer 24. The through openings 32 have substantially vertical side walls 32' (i.e., ones that extend along Z).

Figure 9:
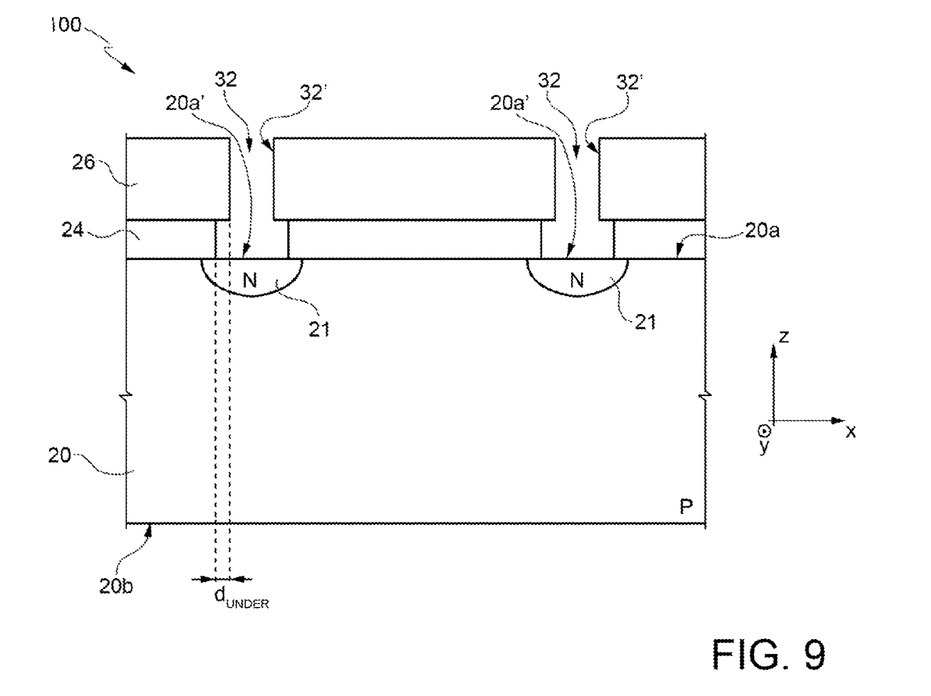

The next step (FIG. 9) is to proceed with development of the first resist layer 24 in the areas of said resist layer exposed through the through openings 32. The first resist layer 24 is of a negative type, i.e., it is removed in areas not impressed by photolithography. During the step of FIG. 7, only the second resist layer 26 is impressed, and not the first resist layer 24. Consequently, during the development step of FIG. 9, the first photoresist layer is etched by the developer also in regions that extend underneath the second resist layer 26, in directions parallel to the plane XY. Knowing the rate of etching of the first resist layer 24, it is possible to define a duration of etching such as to enable complete removal of the first resist layer 24 exposed in an area corresponding to the through openings 32 and also laterally underneath the second resist layer 26 for an extension $d_{UNDER}$, measured on the cross section represented in FIG. 9, of between 200 nm and 600 nm. Respective regions 20a' of the top surface 20a of the semiconductor body 20 are thus exposed.

According to one embodiment, the development of the first photoresist layer 24 and of the second photoresist layer 26 is performed in a single step using one and the same liquid developer. In this case, the steps of FIGS. 7 and 8 are performed in one and the same, continuous, processing step.

According to a different embodiment, the development of the first and second photoresist layers 24, 26 is performed in two separate steps, using respective developers.

Next (FIG. 10), a step is performed of deposition of metal material, in particular nickel. As an alternative to nickel, it is possible to use other metals, for example, aluminum, or transition metals, such as, for example, gold or titanium, or others still. In the description, reference will be made in a particular, but non-limiting, way to nickel.

The step of deposition of metal material represented in FIG. 10 is carried out, in particular, by a process of evaporation (which enables operation at lower temperatures than in the case of the sputtering process).

Following upon the step of deposition, metal regions 34a, 34b, 34c (in particular, as has been said, nickel) extend over the second resist layer 26, in areas corresponding to side walls 32' of the through openings 32, and over part of the exposed regions 20a' of the top surface 20a of the semiconductor body 20. In particular, the metal regions 34c extend vertically aligned (i.e., aligned along Z) to the side walls 32' of the through openings 32. In fact, during the step of deposition of the metal material, the second resist layer 26 functions as deposition mask, preventing any formation of further metal regions on the portions of the top surface 20a of the semiconductor body 20 that extends underneath the second resist layer 26.

In order to obtain metal regions 34c separate from the metal regions 34b, the metal regions 34c have a thickness $h_M$ (measured along Z) smaller than the thickness $h_{R1}$ of the first resist layer 24. Furthermore, once again to form metal regions 34c separate from the metal regions 34b, the metal regions 34c have a thickness $h_M$ (measured along Z) smaller than the thickness $h_{TOT} = h_{R1} + h_{R2}$ (once again measured along Z) given by the sum of the thickness of the first resist layer 24 and the thickness of the second resist layer 26; for example, $h_M$ is less by approximately 10-30% than $h_{TOT}$. According to one embodiment provided by way of example, the first resist layer 24 has a thickness $h_{R1}$ of approximately 300 nm, the second resist layer 26 has a thickness $h_{R2}$ of approximately 500 nm, and the metal regions 34c have a respective thickness $h_M$ of approximately 200 nm.

According to a further embodiment, the thickness $h_M$ is less by approximately 25%-30% than the value of $h_{R1}$ (i.e., $h_M$ is between approximately $0.7 \cdot h_{R1}$ and $0.75 \cdot h_{R1}$).

It is evident that, in any case, the thicknesses $h_{R1}$ and $h_{R2}$ of the first and second resist layers 24, 26 (during the steps of FIGS. 5 and 6) can be chosen according to the desired thickness $h_M$ desired for the metal regions 34c.

Figure 11:
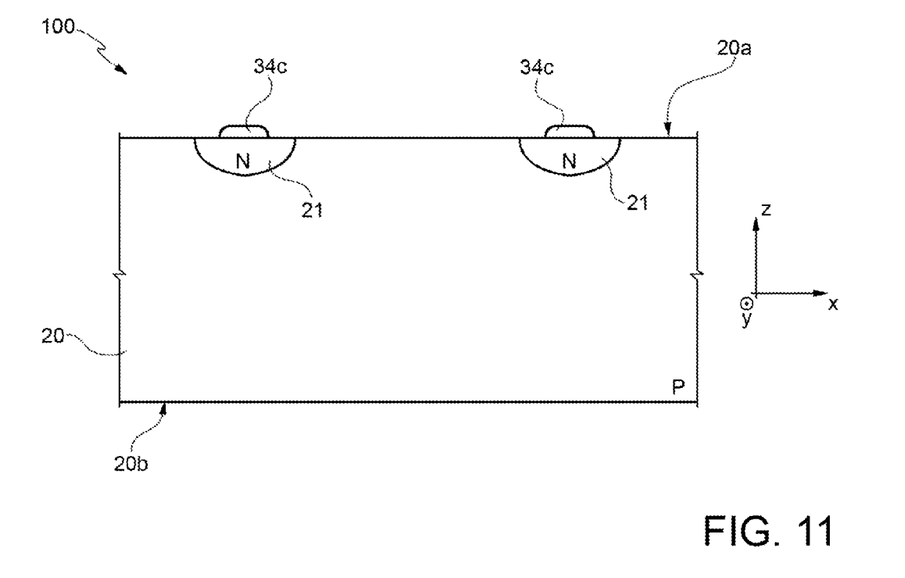

Next (FIG. 11), a step of removal of the first and second resist layers 24, 26 is carried out. This step involves consequent removal of the metal regions 34a and 34b, fixed with respect to the second resist layer 26, but not of the metal regions 34c that, as has been said, are fixed with respect to the semiconductor body 20 alone. The step of FIG. 11 can be performed using a solvent designed to remove the first resist layer 24 without damaging the wafer 100. For example, in the case previously described, in which the first resist layer 24 is made of PMGI, it is advantageous to use a solvent with a base of N-methyl-pyrrolidone, also known as NMP. This step is performed by means of one or more baths at a temperature of some tens of degrees centigrade, for example, 60° C., for approximately 20-30 minutes, followed by a rinsing step.

Finally (FIG. 12), a rapid thermal annealing (RTA), at a temperature of between approximately 700 and 1100° C., for example, approximately 1000° C., for a period of between 40 s and 70 s, for example, approximately 60 s, enables formation of silicide regions 40 in an area corresponding to the top surface 20a of the wafer 20 where the metal regions 34c are present. The type of silicide depends upon the material of the metal regions 34c. In the case where the metal regions 34c consist of nickel, the RTA step leads to formation of regions 40 of nickel silicide ($Ni_2Si$). The process of formation of nickel silicide, deriving from the high-temperature chemical reaction of silicon molecules of the silicon-carbide substrate with the nickel of the metal regions 34c is a process in itself known and hence not described any further herein.

Figure 12:
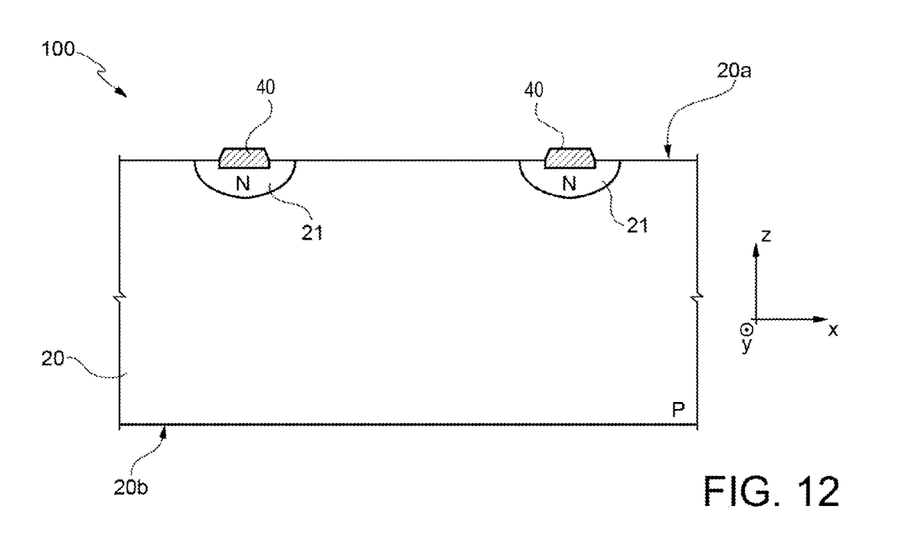

The silicide regions 40 thus formed provide a conductive interface for the electrical coupling (ohmic contact) between the conductive regions 21 and the metal contacts that provide conduction terminals of the electronic devices.

Figure 13:
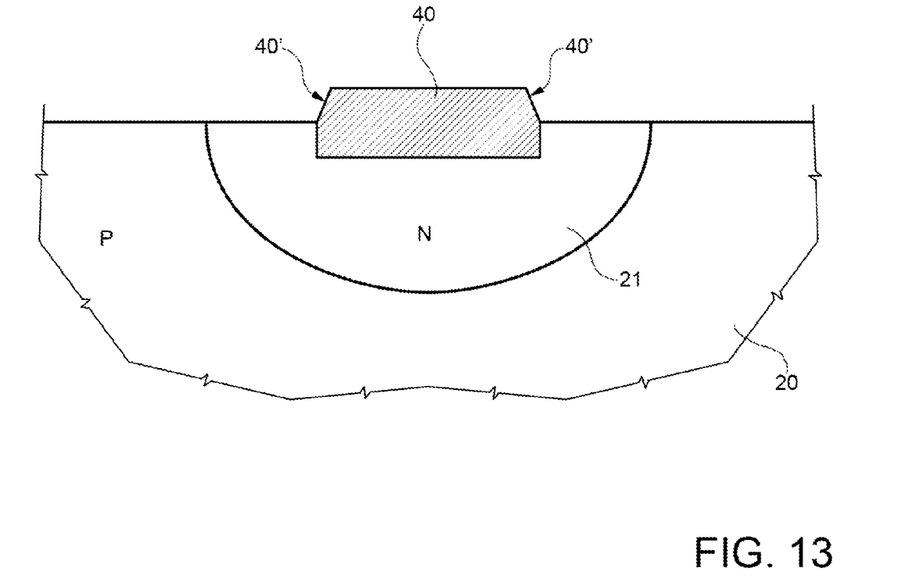

FIG. 13 shows in cross-sectional view an enlarged portion of a silicide region 40, where lateral spacers 40' are more clearly illustrated, which extend in a direction transverse to the plane XY.

These spacers 40' are generated as a consequence of the fact that the metal regions 34c are free laterally and hence the nickel reacts with the SiC substrate, during the RTA step, also laterally, thus forming the spacers 40'.

It is advantageous to take into consideration the dimensional variation of the silicide regions 40 on account of formation of the spacers 40' already during the step of photolithographic definition of the openings 32 (FIGS. 7 and 8), to form openings 32 that have a dimension, along X, smaller than the dimension desired for the silicide regions 40, by an amount equal to the extension, once again along X, of the spacers 40'.

Figure 14:
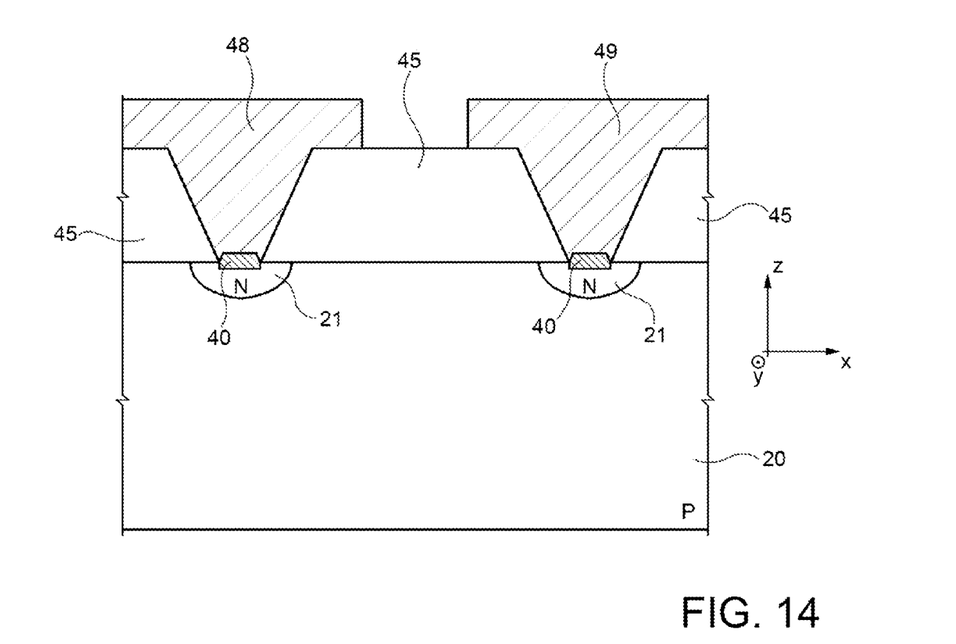

FIG. 14 shows, by way of example, the wafer 100, in which formed on the top surface 20a of the semiconductor body 20 are a dielectric layer 45 (for example, silicon oxide) and conduction terminals 48, 49 made of metal material, which extend through the dielectric layer 45 until they contact the semiconductor body 20 in an area corresponding to the silicide regions 40.

The process previously described with reference to FIGS. 5-14 may be applied to the manufacture of any electronic device having a silicon-carbide substrate on which it is desired to form one or more nickel-silicide regions in order to create a conductive interface. The electronic devices comprise, for example, diodes, N-channel MOSFETs, P-channel MOSFETs, vertical-channel VMOS transistors, JFETs.

From an examination of the characteristics of the disclosure obtained according to the present disclosure the advantages that it affords are evident.

In particular, according to the present disclosure the problems deriving from the defects caused by the interaction between the nickel layer and the TEOS oxide during RTA, described with reference to the known art, are overcome.

Moreover, since a step of etching with hydrofluoric acid HF is not present, the nickel-silicide regions are not damaged by the HF.

In addition, the process of formation of the nickel-silicide regions is considerably simplified, with consequent advantages in terms of economy of the process and reduction of production times.

Furthermore, the process of manufacture according to the present disclosure enables geometrical definition of the silicide regions, which may have any shape and/or size, and in which the only limit is represented by the limits of the photolithographic technique used.

Finally, the process according to the present disclosure is completely compatible with possible materials (oxides, dielectric materials, semiconductors, etc.) already present on the wafer, in so far as solvents commonly employed in lithography are used.

Finally, it is clear that modifications and variations may be made to what has been described and illustrated herein, without thereby departing from the sphere of protection of the present disclosure.

For instance, the method for forming the silicide regions described according to the present disclosure can be used for forming one or more silicide regions outside the active area of the electronic device, for example, in an area corresponding to an edge region of the electronic device, and in any case interface regions that provide an ohmic contact are to be formed.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A method, comprising:
    forming electrical-contact interface regions of an electronic device on a wafer, the wafer including a silicon-carbide semiconductor body of first type of conductivity, the body having at least one conductive region of a second type of conductivity, forming the interface regions including:
    forming a first resist layer on a surface of the semiconductor body;
    forming a second resist layer on the first resist layer;
    forming a through opening through the second resist layer by developing portions of the second resist layer, the through opening being at least partially aligned with said conductive region;
    exposing the surface of the body in an area corresponding to said conductive region by developing, through the through opening, portions of the first resist layer that extend underneath the through opening;
    removing portions of the first resist layer that extend laterally with respect to the through opening;
    forming a metal region on the body by depositing a first metal material on the wafer in the area corresponding to the conductive region;
    removing completely the first and second resist layers from the wafer; and
    forming a silicide region in electrical contact with the conductive region by thermally treating the wafer.

2. The method according to claim 1 wherein the first metal material is nickel, and the silicide region includes nickel silicide.

3. The method according to claim 1 wherein the first resist layer is a photoresist layer of a positive type, and the second resist layer is a photoresist layer of a negative type.

4. The method according to claim 1 wherein the first resist layer is a polydimethylglutarimide-based resist layer.

5. The method according to claim 1 wherein the second resist layer is a resist layer that is one from among: i-line photoresist, g-line photoresist, broadband photoresist, deep-UV photoresist, 193-nm photoresist, and e-beam photoresist.

6. The method according to claim 1 wherein the surface of the semiconductor body lies in a plane, and wherein removing portions of the first resist layer and the second resist layer include removing portions in a first direction substantially orthogonal to said plane, and removing portions of the first resist layer in a second direction substantially orthogonal to the first direction.

7. The method according to claim 1 wherein forming the metal region includes depositing said first metal material until reaching a first thickness from the surface of the semiconductor body, the first thickness being smaller than a second thickness of the first resist layer.

8. The method according to claim 7 wherein the second resist layer has a third thickness, the first thickness being 10% and 30% smaller than a sum of the second and third thicknesses.

9. The method according to claim 1 wherein depositing the first metal material includes depositing by evaporation.

10. The method according to claim 1 wherein thermally treating the wafer includes a rapid thermal annealing at a temperature between approximately 800 and 1100° C. for a time between approximately 40 and 70 seconds.

11. The method according to claim 1, further comprising the steps of:
    forming, on the surface of the semiconductor body, a dielectric layer;
    forming an opening through the dielectric layer by removing portions of the dielectric layer to expose the silicide region; and
    forming an electrical-contact terminal through the dielectric layer, electrically contacting the silicide region.

12. The method according to claim 11 wherein forming the electrical-contact terminal includes depositing a second metal material on the silicide region in said opening of the dielectric layer.

13. The method according to claim 1 wherein said electronic device is one from among the group consisting of a diode, a horizontal-channel transistor, vertical-channel transistor, and a JFET.

14. A method, comprising:
    forming a first doped region in a substrate;
    forming a first resist layer on the substrate;
    forming a second resist layer on the first resist layer;
    forming a first portion of a first opening in the second resist layer, the first opening being positioned above the first doped region in the substrate, sidewalls of the first resist forming edges of the first opening;
    forming a second portion of the first opening in the second resist layer, the second portion being wider than the first portion of the first opening;
    forming a first conductive region on the first doped region exposed by the first opening by forming a conductive layer on the second resist layer, on the edges of the first opening, and on the first doped region exposed by the first opening;
    removing the first resist layer, the second resist layer, and portions of the conductive layer on the second resist layer and on the edges of the first opening;
    forming a silicide region by annealing the first conductive region.

15. The method of claim 14 wherein the silicide region has a top surface that is smaller than a bottom surface, angled sidewalls connecting the top surface to the bottoms surface.

16. The method of claim 15 wherein the angled sidewalls are inwardly angled towards a center axis of the silicide region.

17. The method of claim 14 wherein the first portion of the first opening has a first width, the second portion of the first opening has a second width, and the conductive region has a third width that is closer in size to the first width than to the second width.

18. The method of claim 16 wherein the second width is smaller than a surface area of the first doped region.

19. A method, comprising:
    forming a first doped region in a substrate;
    forming on the substrate a first resist layer having a first opening that exposes the first doped region;
    forming on the first resist layer a second resist layer having a second opening aligned with the first opening, the second opening being more narrow than the first opening;
    forming a first conductive region on the first doped region after forming the first and second conductive regions and the first and second openings;
    removing the first resist layer and the second resist layer after forming the first conductive region;
    forming a silicide region by annealing the first conductive region.

20. The method of claim 19, wherein the silicide region has a top surface, a bottom surface, and angled sidewalls connecting the top surface to the bottoms surface, the top surface being smaller than the bottom surface.

21. The method of claim 19, wherein the first opening is formed after forming the second opening.

22. The method of claim 19, wherein the first opening has a first width, the second opening has a second width, and the conductive region has a third width that is closer in size to the second width than to the first width.

23. The method of claim 22, wherein the second width is smaller than a surface area of the first doped region.

* * * * *